(12) United States Patent
Liao et al.

(10) Patent No.: US 11,145,754 B2
(45) Date of Patent: Oct. 12, 2021

(54) GATE EXTRACTION AND INJECTION FIELD EFFECT TRANSISTORS AND METHOD FOR CONTROLLING ITS CHANNEL CARRIER AMOUNT

(71) Applicant: UNIVERSITY OF ELECTRONIC SCIENCE AND TECHNOLOGY OF CHINA, Chengdu (CN)

(72) Inventors: Yongbo Liao, Chengdu (CN); Ping Li, Chengdu (CN); Rongzhou Zeng, Chengdu (CN); Qingwei Zhang, Chengdu (CN); Xia Li, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/699,760

(22) Filed: Dec. 2, 2019

(65) Prior Publication Data

US 2020/0105913 A1   Apr. 2, 2020

Related U.S. Application Data

(63) Continuation-in-part of application No. PCT/CN2018/095553, filed on Jul. 13, 2018.

(30) Foreign Application Priority Data

Jul. 18, 2017   (CN) .......................... 201710584687.1

(51) Int. Cl.
*H01L 29/76* (2006.01)
*H01L 29/51* (2006.01)
(Continued)

(52) U.S. Cl.
CPC ...... *H01L 29/7606* (2013.01); *H01L 29/0847* (2013.01); *H01L 29/45* (2013.01); *H01L 29/51* (2013.01)

(58) Field of Classification Search
CPC . H01L 29/7606; H01L 29/0847; H01L 29/45; H01L 29/51; H01L 29/49
See application file for complete search history.

(56) References Cited

U.S. PATENT DOCUMENTS

2012/0248416 A1   10/2012   Zhou et al.
2016/0343805 A1*  11/2016   Lee ..................... H01L 29/0847
(Continued)

FOREIGN PATENT DOCUMENTS

| CN | 102142455 A | 8/2011 |
|---|---|---|
| CN | 103311276 A | 9/2013 |
| CN | 103377887 A | 10/2013 |

OTHER PUBLICATIONS

R. Xie, et al., A 7nm FinFET Technology Featuring EUV Patterning and Dual Strained High Mobility Channels, IEDM, p. 47, 2016.
(Continued)

*Primary Examiner* — Douglas W Owens
(74) *Attorney, Agent, or Firm* — Bayramoglu Law Offices LLC

(57) ABSTRACT

The methods of gate extraction and injection FET and channel carrier quantity control related to microelectronics technology and semiconductor technology. The gate extraction and injection FET of the invention is provided with a source, a drain, a gate and a channel semiconductor area on the insulating layer. A gate dielectric layer is arranged between the gate and the channel semiconductor region, wherein, the gate dielectric layer is a thin film material with resistance values of $10^3$-$10^{16}\Omega$ and the channel semiconductor region is a two-dimensional semiconductor or a three-dimensional semiconductor with two-dimensional semiconductor material characteristics (1-10 cellular crystal layers). The advantages of the invention are that the power
(Continued)

consumptions of the devices and the integrated circuits can be greatly reduced by a few orders of magnitude.

7 Claims, 8 Drawing Sheets

(51) Int. Cl.
*H01L 29/08* (2006.01)
*H01L 29/45* (2006.01)

(56) References Cited

U.S. PATENT DOCUMENTS

2018/0166537 A1* 6/2018 Tateno .................... H01L 29/10
2019/0165120 A1* 5/2019 Sato .................. H01L 21/28026

OTHER PUBLICATIONS

Ed Kurniawan et al., Effect of fin shape of tapered FinFETs on the device performance in 5-nm node CMOS technology, Microelectronics Reliability, Aug. 2017.

Vasanthan Thirunavukkarasu, Yi-Ruei Jhan, Yan-Bo Liu et al Performance of Inversion, Accumulation, and Junctionless Mode n-Type and p-Type Bulk Silicon FinFETs With 3-nm Gate Length. IEEE Electron Device Letters, 2015, 645-647, 36(7).

K.S. Novoselov et al. Room-temperature electric field effect and carrier-type inversion in graphene films, submitted to Nature on Feb. 5, 2004.

Frank Schwierz, Graphene Transistors: Status, Prospects, and Problems, Peoceeding of the IEEE, 2013,p. 1567-1584, 101.

Xiaolin Li et al., Chemically Derived, Ultrasmooth Graphene Nanoribbon Semiconductors, Science, 2008, p. 1229.

G. Iannaccone et al., Perspectives of graphene nanoelectronics: probing technological options with modeling, IEDM, 2009, p. 246.

L. Britnell, et al., Field-effect tunneling transistor based on vertical graphene heterostructures, Science, 2012, p. 947.

Gongtao Wu, et al., A Graphene-Based Vacuum Transistor with a High on/off Current Ratio, Adv. Funct. Mater., 2015, p. 5972.

K. S. Novoselov, V. I. Fal'Ko, L. Colombo, P. R. Gellert, M. G. Schwab & K. Kim, A roadmap for graphene, Nature, 2012, p. 192-200, 490.

Wen-Chin Lee, Hisamoto, D., Kedzierski, J. , Takeuchi, H. , Asano, K. , Kuo, C., Anderson, E., Tsu-Jae King, Bokor, J., Chenming Hu, FinFET—A Self-Aligned Double-Gate MOSFET Scalable to 20 nm: IEEE Transactions in Electron Devices, 2000, 2320-2325.

Gordon E. Moore, Cramming more components onto integrated circuits, Electronics, Jul. 1, 2016.

Thompson S., Packan P. Bohr M., MOS Scaling: Transistor Challenges for the 21st Century, Intel Technology Journal, 1998; p. 1-18.

Anantha P. Chandrakasan, Samuel Sheng, and Robert W., Brodersen, Low-Power CMOS Digital Design, IEEE J Sol Sta Cire, 1992, 27(4).

Simon M Sze, Kwok K. Ng, Physics of Semiconductor Devices, Wiley Interscience, second edition, 1996, Newyork.

Xingbi Chen et al., Microelectronic Devices, Feb. 2011, third edition.

* cited by examiner

GATE EXTRACTION AND INJECTION FIELD EFFECT TRANSISTORS AND METHOD FOR CONTROLLING ITS CHANNEL CARRIER AMOUNT

CROSS REFERENCE TO THE RELATED APPLICATIONS

This application is the continuation-in-part application of International Application No. PCT/CN2018/095553, filed on Jul. 13, 2018, which is based upon and claims priority to Chinese Patent Applications No. 201710584687.1 filed on Jul. 18, 2017, the entire contents of which are incorporated herein by reference.

TECHNICAL FIELD

The invention relates to microelectronics and semiconductor technology.

BACKGROUND

The Complementary Metal Oxide Semiconductor (CMOS) integrated circuits (ICs) based on the silicon semiconductor material have been following Moore's Law for several decades, and the feature size of the CMOS has been continuously scaled down. Currently, the chips with the 7 nm process technology have begun mass production. In addition, the 5 nm process technology is developed, and even 3 nm process technology is studied. Hence, the thickness of the substrate of the silicon integrated circuits is keeping deceased. As a result, the silicon substrate of the integrated circuits is increasingly developing toward two-dimensional semiconductors.

The first graphene field-effect transistor (GFET) with a single atomic layer graphene was fabricated in 2004. Due to the zero-band gap of graphene, before the Chinese invention patent corresponding to this patent was published, there was no report on turning-off-able GFETs with large-area monoatomic layer graphene. In the embodiment of the Chinese invention patent corresponding to this patent, a GFET with large-area single-atomic-layer graphene is turned off for the first time, and the On/Off ratio of the drain to source current, Ids, reaches to $5*10^7$.

The invention of the single atomic layer GFET brought hope for graphene as a new generation semiconductor, however, the further investigation indicated the applications of the GFET in digital logic switch were seriously limited. Due to the zero band-gap of the graphene, the GFET could not be well turned off. Many efforts were made to solve this problem, among them, the graphene-nano-ribbon (GNR) got the largest on/off ratio $1 \times 10^7$). However, the main problem of GNR was its lower carrier mobility of graphene as the result of the introduction of additional carrier scattering. The traditional thinking for turning off the GFET was that the band-gap of the graphene must be opened firstly. Other alternative methods were tried to solve the problem, including field-effect tunneling transistors (on/off ratio $1 \times 10^5$) and the graphene-based vacuum transistor (GVT, on/off ratio $1 \times 10^6$). Nobel laureate, Dr. Geim, had predicted that the use of graphene in logic could be realized after 2025. In a word, due to no gate extracting and injecting effect in the traditional GFET, the number of carriers in the channel cannot be reduced by orders of magnitude by controlling gate current. Consequently, only very low On/Off ration is obtained, the GFET can not be turned off and its power consumption is high.

The gate of the traditional Si MOSFET also has no function of extraction and injection carrier in the channel, therefore, the traditional Si MOSFET or CMOS IC has high power consumption. The power consumption of the traditional Si MOSFET or CMOS IC can only be reduced by the scaling down principle.

It is reported that researchers have been studying the preparation technology of FINFETs with a feature size of 3 nm. In the FINFET with a feature size of 2 nm, the thickness of the semiconductor channel modulated by a single-sided gate is about 1 nm and is about two silicon atomic layers. Thus, the channel material of Si MOSFETs is tending to be two-dimensional. So, the rules found in the Gate Extraction and Injection Transistors (GEITs) could be applicable to future silicon devices and ICs. Since the Moore's Law is proposed in 1965, silicon integrated circuits have been following the scaling down principle. With the further reduction of the key size, the operating voltage of the device can not be reduced proportionally after less than 22 nm, which leads to the problem of the power consumption of the device becomes more and more serious.

In traditional MOS transistors, the resistance value of the gate dielectric material with insulator characteristics, such as $SiO_2$, is infinite. The gate of the MOS transistor controls the conductivity of the semiconductor channel through the gate capacitance. The transfer characteristic curve of traditional NMOS transistor is shown in FIG. 18. The transfer characteristic curve of MOSFET reflects the control ability of gate voltage $V_{GS}$ to drain current $I_D$. However, because gate dielectrics are insulators, it is impossible to realize the function of the gate extraction and injection of the channel carriers.

Historically, because of the dominant digital CMOS circuit process, analog IC engineers had to endure lower and lower operating voltages. The lower operating voltage is very unfavorable for the improvement of the signal-to-noise ratio of the analog integrated circuit.

SUMMARY

The technical problem to be solved by the present invention is to provide a gate extraction and injection field effect transistor, which can significantly reduce the power consumption of devices and integrated circuits by orders of magnitude, and improve the working voltage of devices and integrated circuits, while the power consumption of devices and integrated circuits is still lower than that of traditional devices and integrated circuits. This is because P=I*V, when the current I can be significantly reduced, the voltage V can be increased appropriately.

To solve the technical problems, the technical solution adopted by this invention is: the characteristics of gate extraction and injection field effect transistors are as following: 1. A channel semiconductor region is arranged on the insulating layer. 2. The source and drain electrodes are arranged on the channel semiconductor and are directly connected with the channel semiconductor. 3. The gate of the device is arranged between the source and the drain. 4. A gate dielectric layer is arranged between the gate and the channel semiconductor region. 5. The gate dielectric layer is characterized by a thin film material with resistance values of $10^3 \sim 10^{16} \Omega$. 6. The material of the channel semiconductor region is a two-dimensional semiconductor or a three-dimensional semiconductor having the characteristics of the two-dimensional semiconductor material.

The gate dielectric layer is made of one of the following thin film materials, or two or more combinations: SIPOS, alumina, amorphous silicon, polycrystalline silicon, amorphous SiC, polycrystalline SiC, amorphous GaN, polycrystalline GaN, amorphous diamond, polycrystalline diamond, amorphous GaAs, polycrystalline GaAs.

The channel semiconductor region is made of one of the following two-dimensional semiconductor materials: Graphene, Black phosphorus, $MoS_2$, $MoSe_2$, $WSe_2$, Silicene.

The three-dimensional semiconductor having the characteristics of the two-dimensional semiconductor material is: One of the following semiconductors whose thickness is less than or equal to 10 atomic layers: Silicon, Germanium, GaAs, GaN, SiC, Diamond.

Further, the channel material is an intrinsic semiconductor; Source and drain are metal electrodes; When the device is turned on, the ohmic contact is formed between the channel semiconductor and the metal electrodes; When the device is turned off, the Schottky contact is formed between the channel semiconductor and the metal electrodes.

The channel semiconductor region comprises two first conductive type regions and one second conductive type region, one first conductive type region is between the source and the second conductive type regions, and the other first conductive type region is between the drain and the second conductive type region.

The material of the first conductivity type region is a N-type semiconductor and the material of the second conductivity type region is a P-type semiconductor. Or the material of the first conductivity type region is a P-type semiconductor and the material of the second conductivity type region is a N-type semiconductor. Or the material of the first conductivity type region is a N-type semiconductor and the material of the second conductivity type region is a N-type semiconductor. Or the material of the first conductivity type region is a P-type semiconductor and the material of the second conductivity type region is a P-type semiconductor.

Alternatively, the channel semiconductor region comprises two first conductive type regions and one second conductive type region, one first conductive type region is between the source and the second conductive type regions, and the other first conductive type region is between the drain and the second conductive type region.

The material of the first-conductivity type region is heavily-doped semiconductors and the material of the second-conductivity type region is lightly-doped semiconductors. Or the material of the first-conductivity type region is heavily-doped semiconductors and the material of the second-conductivity type region is Intrinsic semiconductor.

The invention also provides a carrier number control method for gate extraction and injection field effect transistors, and its characteristics include the following steps:

The first: a first gate voltage with the opposite polar to charge of the channel carriers is applied, the carriers in the channel are taken out.

The second: the second gate voltage with a polar opposite to the first gate voltage is applied, as a result, the carriers are injected into the channel. The number of injected carriers from the gate is controlled by choosing a small absolute value of the second gate voltage. As a result, the low power consumption of the device is realized in this way.

The beneficial effects of the present invention are as follows:
1. The power consumption of devices and integrated circuits is significantly reduced by orders of magnitude; Since the device operating current Ids can be reduced by orders of magnitude, without reducing of the device operation Vds=Vgs, low power consumption of the device and the circuit can still be realized. Thereby, the improvement in analog performance of the device and circuit, such as the signal-to-noise ratio and the anti-interference ability can be brought about;
2. For MOS transistors fabricated by semiconductors with zero band-gap, such as graphene, the low current and low power analog amplification can be realized.
3. As the number of carriers decreases, the collision scattering between carriers decreases, resulting in an increase in the operating frequency of the device;
4. When the principle of the present invention used in silicon devices, the traditional notion that insulated gate dielectrics must be used in silicon MOSFETs is broken through, which results in a significant reduction in the power consumption of silicon MOSFET devices by orders of magnitude.
5. The devices based on the principle of GEIT can be used for logic switch, non-volatile storage device, programmable device, small signal amplifier. The power consumption of the circuit can be effectively reduced and the operating frequency or switching speed of the circuit can be increased.

Figure 1:
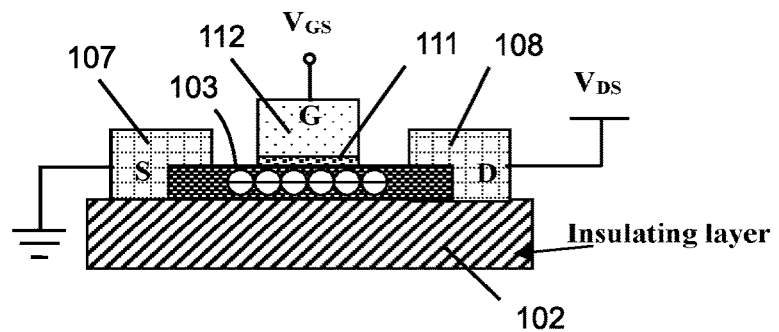
FIG. 1 is the first schematic diagram of the GEIT of this invention in its operating state. It shows that when the gate voltage is low, the extraction function of the gate is weak, a lot of carriers exist in the channel.
Figure 2:
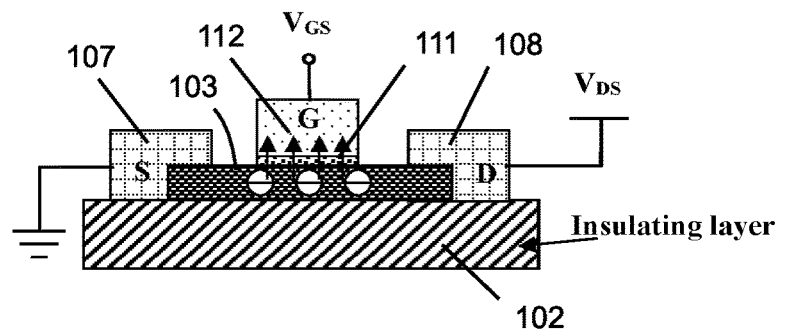
FIG. 2 is the second schematic diagram of the GEIT of this invention in its operating state. It shows that when the gate voltage is higher, the extraction function of the gate is stronger, less carriers exist in the channel.
Figure 3:
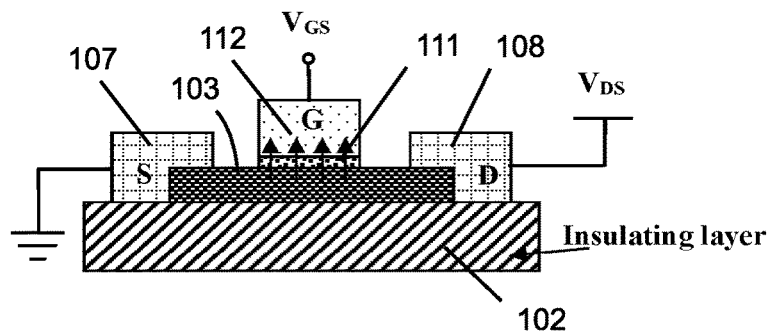
FIG. 3 is the third schematic diagram of the GEIT of this invention in its operating state. It shows that when the gate voltage is high enough, there is almost no carrier in the channel. Namely, on this condition, almost all the carriers have been drawn out by the gate.
Figure 4:
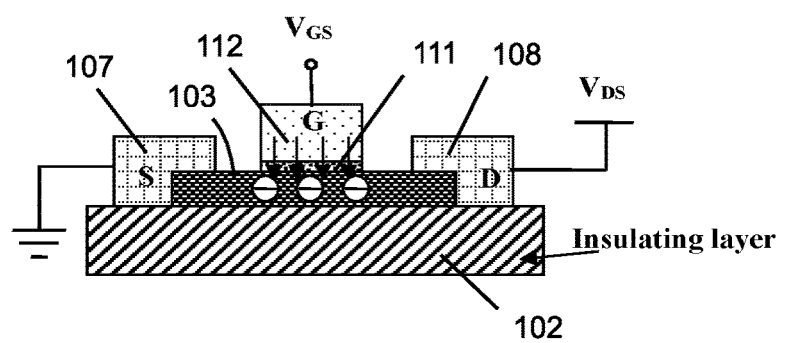
FIG. 4 is the fourth schematic diagram of the GEIT of this invention in its operating state. It is shown that some carriers are injected into the channel from the gate at a low absolutely value of the negative gate voltages.
Figure 5:
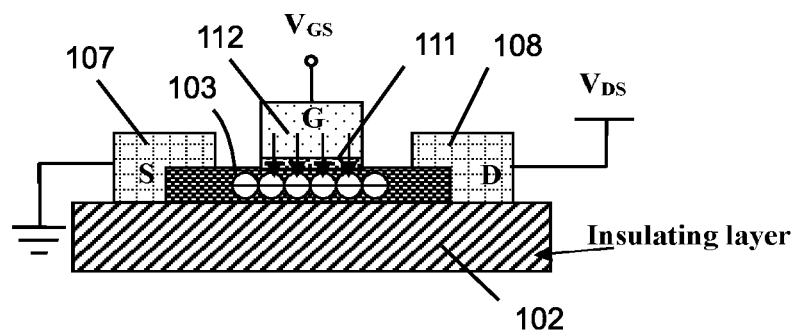
FIG. 5 is the fifth schematic diagram of the GEIT of this invention in its operating state. It is shown that more carriers are injected into the channel from the gate at a higher absolutely value of the negative gate voltages.

Each icon number: 101 base layer, 102 insulating layer, 103 channel semiconductor region, 104, 105, 106 defining photoresist pattern layer of source-drain electrode, 107 source-drain metal layer, 108 drain metal layer, 109, 110 defining photoresist pattern layer of gate electrode, 111 gate dielectric layer, 112 gate metal layer, 113 doped semiconductor material contacting source-drain electrode, 114 doped semiconductor material contacting with drain electrode.

DETAILED DESCRIPTION OF THE EMBODIMENTS

The gate extraction and injection field effect transistor is composed of an insulating substrate, a semiconductor channel, a source electrode, a drain electrode, a gate electrode and a dielectric layer between the channel and gate.

The gate dielectric layer has a resistance of $10^3 \sim 10^{16}\Omega$.

The channel material is a two-dimensional semiconductor material or a three-dimensional semiconductor material with characteristics of two-dimensional semiconductor material.

the material of the gate dielectric layer comprises one of the following materials, or two or more combinations: SIPOS, natural oxidized Alumina, amorphous silicon, polycrystalline silicon, amorphous SiC, polycrystalline SiC, amorphous GaN, polycrystalline GaN, amorphous diamond, polycrystalline diamond, amorphous GaAs, polycrystalline GaAs.

For example, the combination of amorphous silicon and polycrystalline SiC.

For example, the combination of amorphous GaN, polycrystalline GaN, amorphous diamond, amorphous GaAs and polycrystalline GaAs.

The material of the channel semiconductor region is one of the following two-dimensional semiconductor materials: graphene, Black phosphorus, $MoS_2$, $MoSe_2$, $WSe_2$, Silicene.

The three-dimensional semiconductor material with characteristics of two-dimensional semiconductor material whose thickness is less than or equal to 10 cellular crystal layers, comprises one of the following materials: silicon, Germanium, Gallium Arsenide, Gallium Nitride, Silicon Carbide, Diamond.

The channel material is an intrinsic semiconductor; Source and drain are metal electrodes; When the device is turned on, the ohmic contact is formed between the channel semiconductor and the metal electrodes; When the device is turned off, the Schottky contact is formed between the channel semiconductor and the metal electrodes.

Embodiment 1: An Embodiment Having a Schottky Contact

See FIGS. 1-5.

The gate extraction and injection graphene field effect transistor is equipped with a gate (G), a source (S), a drain (D) and a monoatomic graphene channel semiconductor region on the insulating layer (marked Substrate). A gate dielectric layer is arranged between the gate and the channel semiconductor region. The resistance of the gate dielectric layer is $10^9 \sim 10^{12}\Omega$, and the thickness of the channel semiconductor region is $10^9 \sim 10^{12}\Omega$. The thickness of the channel semiconductor region is one atomic layer. The dielectric constant of the gate dielectric layer is 7.5. The material of the channel monoatomic layer graphene channel semiconductor region is intrinsic semiconductor. The source and drain are metal electrodes, When the device is turned off, the Schottky contact is formed between the channel semiconductor and the metal electrodes; When the device is turned on, the ohmic contact is formed between the channel semiconductor and the metal electrodes. The gate dielectric layer is made of alumina with a dielectric constant of 7.5.

Figure 15:
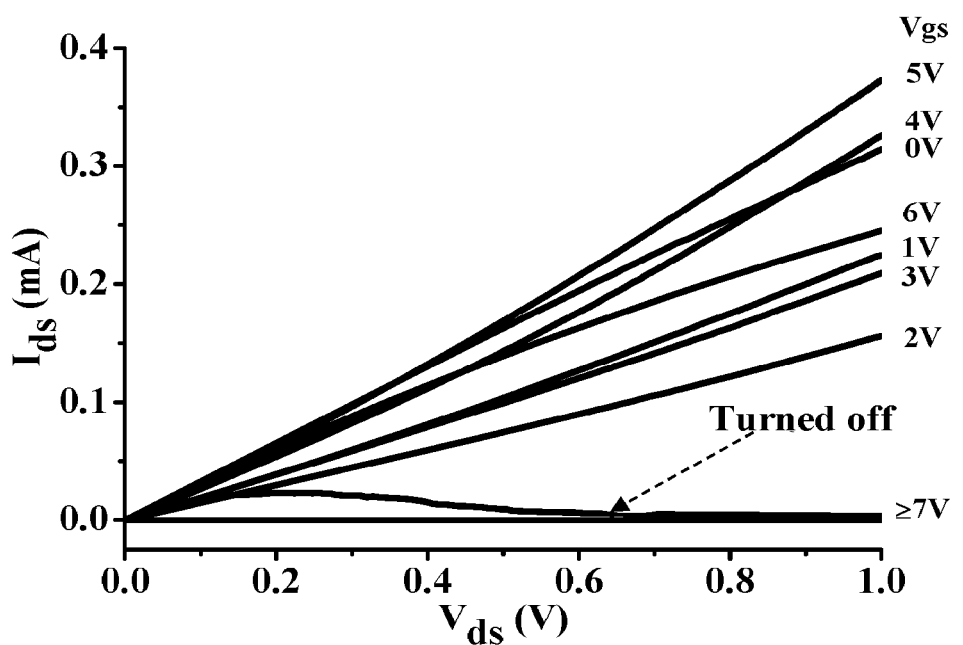
FIG. 15 is an output curve of the transistor of the invention turned off under positive gate voltage.

FIG. 15 is the output curve of the transistor of the present invention under positive gate voltage. When the gate voltage is relatively high, Vgs>7V, the device shows good turn-off characteristics. After the device is turned off, the drain current changes from 400 uA to 5.8 pA, and the Ids switch ratio reaches a record $5*10^7$. It effectively overcomes the defect that graphene transistor cannot be turned off.

Figure 16:
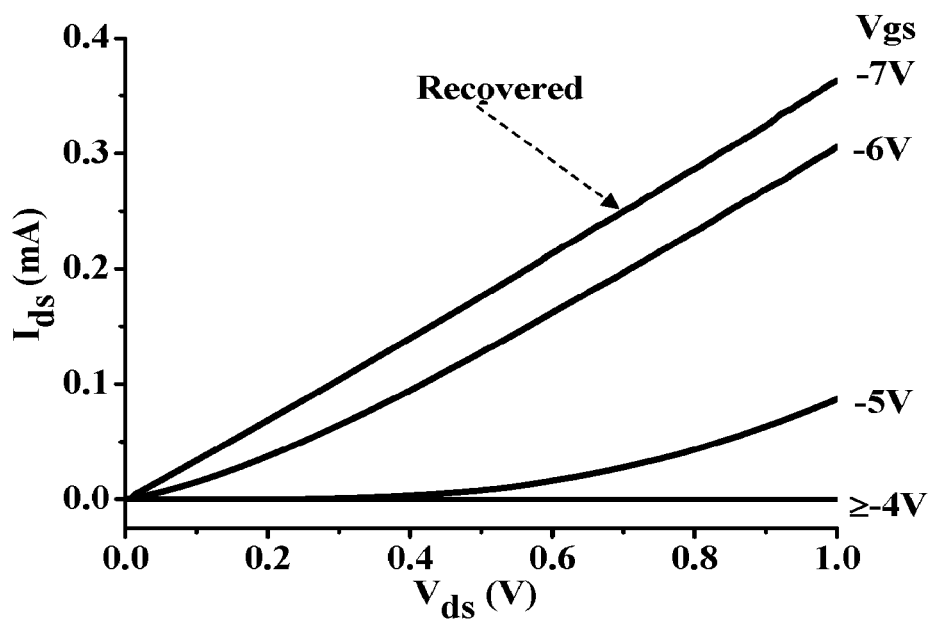
FIG. 16 is an output curve of the transistor of the invention which is turned off under positive gate voltage and turned on with negative gate voltage.
Figure 17:
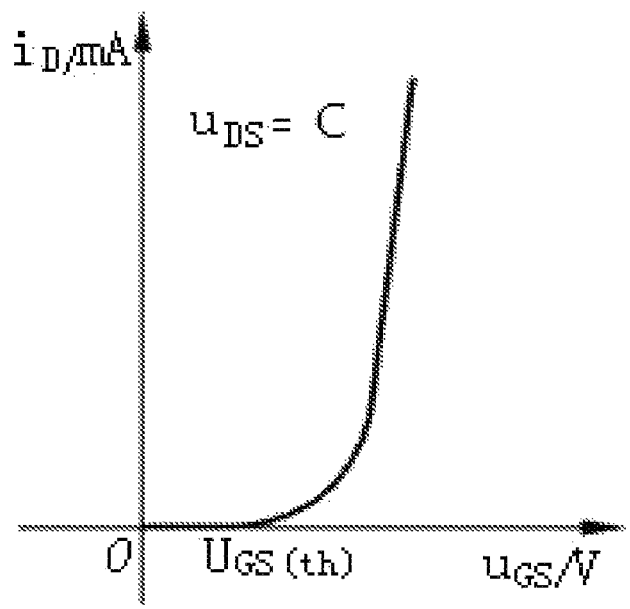
FIG. 17 shows the transfer characteristics of a conventional transistor (NMOS).

FIG. 16 is an output curve of the transistor of the invention which is turned off under positive gate voltage and turned on with negative gate voltage. The gate voltage is scanned from 0V to negative voltage. When the gate voltage is less than −4V, the transistor is turned on. This performance shows that the transistor of the present invention can not only be turned off, but also be turned on. When the device is turned off, if negative gate voltage is not applied, the device will not be turned on. This performance can constitute a new type of non-volatile semiconductor memory.

Figure 18:
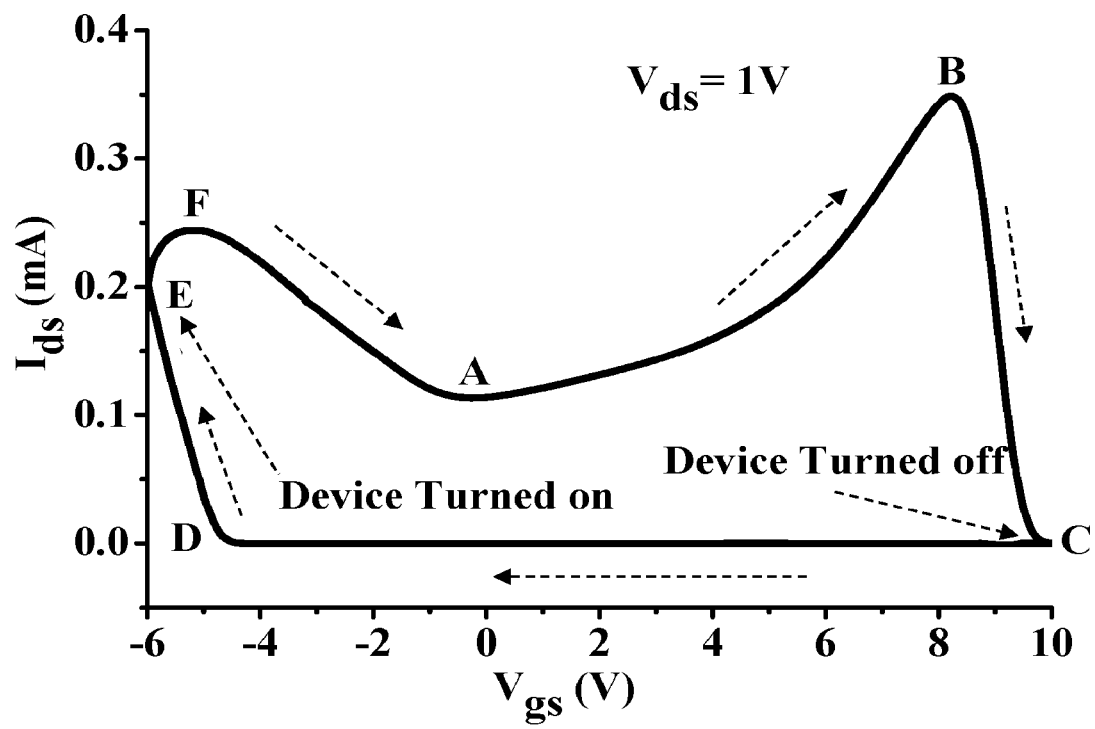
FIG. 18 is a transfer curve with on-off characteristics obtained by the GEIT transistor of the present invention. By comparing FIG. 17 and FIG. 18, it can be seen that the transfer curves of the two devices are obviously different.

FIG. 18 is a transfer curve with on-off characteristics obtained by the transistor of the present invention. This is the first time that a semiconductor device has such a transfer curve. As can be seen from the figure, Ids decreases sharply when Vgs=8.5V in forward scan (−6V to +10V), and is almost zero when Vgs=9.6V (only 8 pA). GEIT is ideally turned off. From the following reverse scan (+10V to −6V)

curve, it can be seen that GEIT is turned off in the process of Vgs=+10V to Vgs=−4.5V. When Vgs=−5V, Ids increases sharply and GEIT is turned on again. It can also be found that the transconductance of the BC and DE segments is very large. This phenomenon shows that the device can not only work normally under the condition of gate conduction, but also achieve a higher Gm gain than the general GFET (compared with the FA and AB segments in FIG. 6).

Figure 19:
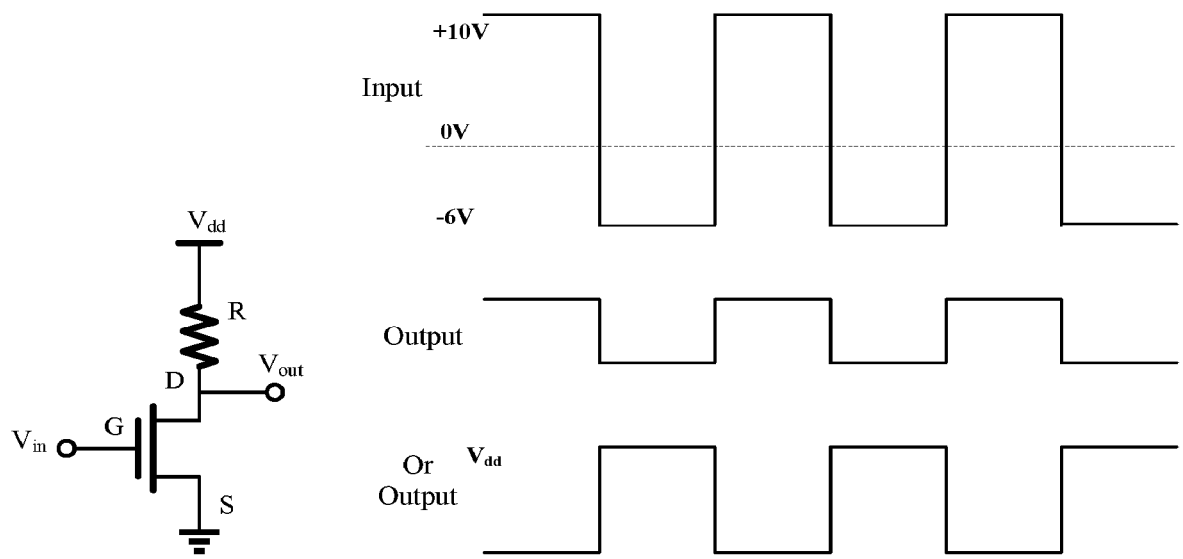
FIG. 19 shows the circuit constructed by the transistor of this invention and the output same-phase waveform and reverse-phase switching waveform.

FIG. 19 shows the circuit constructed by the transistor of the invention and the waveform of the output in-phase and in-phase switching. This performance shows that the transistor of the present invention can realize a switching circuit.

Figure 20:
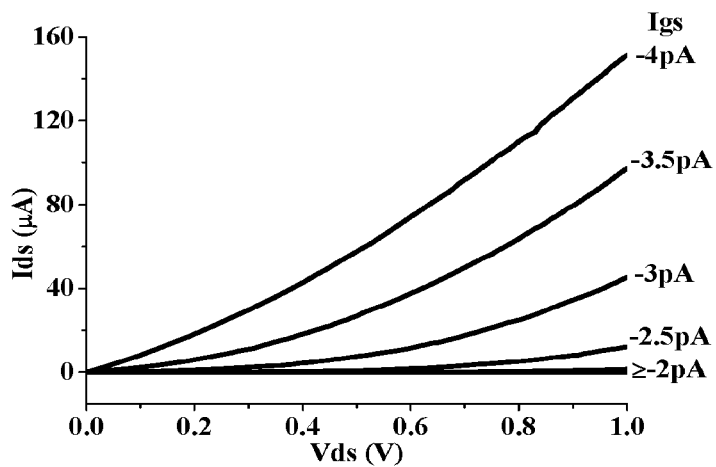
FIG. 20 is the output characteristic curve of the transistor of this invention when driven by gate current.
Figure 21:
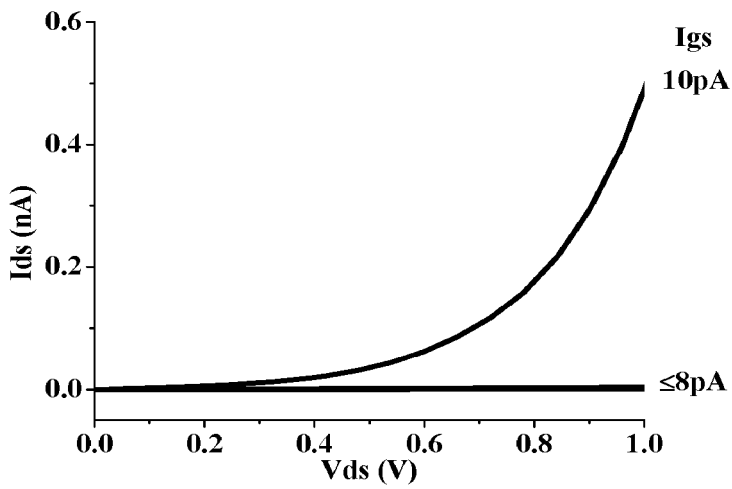
FIG. 21 is the output characteristic curve of 60 nm silicon NMOSFET driven by gate current. The gate current test condition is 0-10 pA.

FIG. 20 is the output characteristic curve of the transistor of the invention when driven by gate current. FIGS. 19 and 20 are the output characteristic curves of 60 nanometer silicon NMOSFET driven by gate current. The gate current test conditions are 0-10 pA and 0-18 pA, respectively. From the output characteristics of FIG. 20, it can be seen that the transistor of the present invention can work normally in the range of Igs=0.5-4 pA, while the 60 nm silicon NMOSFET cannot work normally below Igs=8 pA, and the gate current of the device works normally is 12-18 pA. The areas of graphene and silicon devices are Sg (graphene)=8 um*4 um, Sg/(silicon)=60 nm*120 nm, respectively. The current density of graphene devices is Jgs (graphene)=Igs (graphene)/Sg (graphene)=0.125 (pA/um2). The current density of silicon devices is Jgs (silicon)=Igs (silicon)/Sg (silicon)= 2500 (pA/um2). It can be seen that the current density of graphene devices is much less than that of silicon devices. According to the power density formula, Pgs=Jgs*Vgs, available, Pgs (silicon)/Pgs (graphene)=5200. That is to say, the gate driving power density of the transistor of the invention is about 5200 times smaller than that of 60 nm silicon NMOSFET.

The present invention (GEIT) has the characteristics of gate electrodes pulling out carriers through slightly conductive gate dielectrics to turn off devices and injecting carriers to turn on devices. The saddle-shaped transition curve shown in FIG. 18 is obtained, while the traditional GFET can only obtain V-shaped transition curve (FAB section shown in FIG. 16). From the GEIT transition curve shown in FIG. 18, we can see that in the CD segment, the $I_{ds}$ of GEIT is in the order of pA. Therefore, according to the device power $P=I_{ds}^2R$, GEIT is applied to switching circuits or digital logic circuits, so that the power consumption of devices or circuits is significantly reduced.

Figure 22:
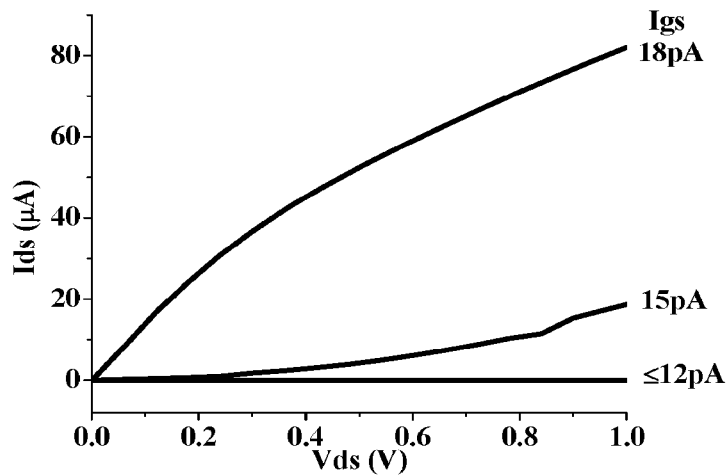
FIG. 22 is the output characteristic curve of 60 nm silicon NMOSFET driven by gate current. The gate current test condition is 0-18 pA.

FIG. 20 illustrates the $I_{ds}$-$V_{ds}$ curve of GEIT with gate length of 4 um and gate width of 8 um driven by constant gate current. FIG. 22 illustrates the $I_{ds}$-$V_{ds}$ curve of 60 nm-Si-MOSFET with gate length of 60 nm and gate width of 120 nm driven by constant gate current. Compared FIG. 20 with FIG. 22, according to the formulas $J_{gs}=I_{gs}/S_g$ ($S_g$ is gate area) and $Pgs=J_{gs}*V_{gs}$, the gate drive power density of GEIT of the present invention is 5200 times of that of 60 nm-Si-MOSFET.

Embodiment 2: An Embodiment Having a PN Junction

Gate extraction and injection field effect transistors are equipped with gate, source, drain and channel semiconductor regions on the insulating layer and gate dielectric layers between the gate and channel semiconductor regions. The resistance values of the gate dielectric layers are $10^3$~$10^{16}\Omega$, and the thickness of the channel semiconductor regions is 1-10 atomic layers. The source and drain metal electrodes are ohmic contacts between the channel semiconductor region and the metal electrodes.

The channel semiconductor region 5 includes two first conductive type regions and one second conductive type region, one first conductive type region is between the source and the second conductive type regions, and the other first conductive type region is between the drain and the second conductive type regions.

The material of the first conductivity type region is a N-type semiconductor and the material of the second conductivity type region is a P-type semiconductor. Or the material of the first conductivity type region is a P-type semiconductor and the material of the second conductivity type region is a N-type semiconductor.

The gate dielectric layer 4 is made of alumina, amorphous silicon, semi-insulating polysilicon or other semi-insulating materials.

Embodiment 3: An Embodiment Having a High-Low Junction

Gate extraction and injection field effect transistors are equipped with gate, source, drain and channel semiconductor regions on the insulating layer and gate dielectric layers between the gate and channel semiconductor regions. The resistance values of the gate dielectric layers are $10^3$~$10^{16}\Omega$, and the thickness of the channel semiconductor regions is 1-10 atomic layers. The source and drain metal electrodes are ohmic contacts between the channel semiconductor region and the metal electrodes.

The material of the first conductive type region is lightly doped semiconductor, and the material of the second conductive type region is heavily doped semiconductor.

Alternatively, the material of the first conductive type region is heavily doped semiconductor, and the material of the second conductive type region is lightly doped semiconductor.

Embodiment 4: An Embodiment Having a Buried Gate Structure

Figure 14:
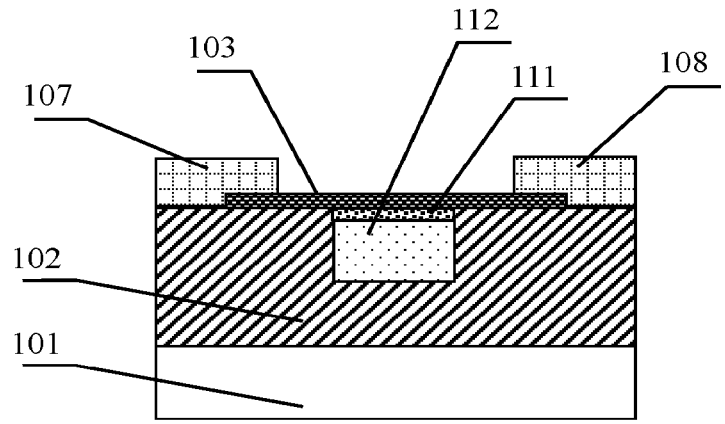
FIG. 14 is a schematic diagram of embodiment 4 of the present invention: a buried gate structure, i.e., a gate medium and a gate electrode under a channel semiconductor region.

See FIG. 14.

The difference between the present embodiment and the first one is that the present embodiment is a buried gate structure, i.e., the gate dielectric and the gate electrode are below the channel semiconductor region.

Embodiment 5: An Embodiment of a Preparation Method (Schottky Contact)

See FIGS. 6-12.

Figure 6:
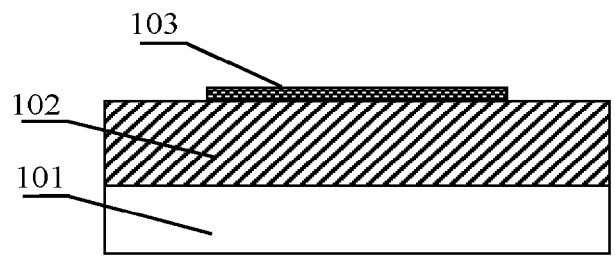
FIG. 6 is a diagram of the first step of the preparation method of the present invention: transferring graphene or channel semiconductor material on a substrate and the graphene or channel semiconductor material is shaped.

The preparation method of the present invention comprises the following steps:

1) A channel semiconductor material layer (such as graphene) 103 is formed on the insulating layer, as shown in FIG. 6.

Figure 7:
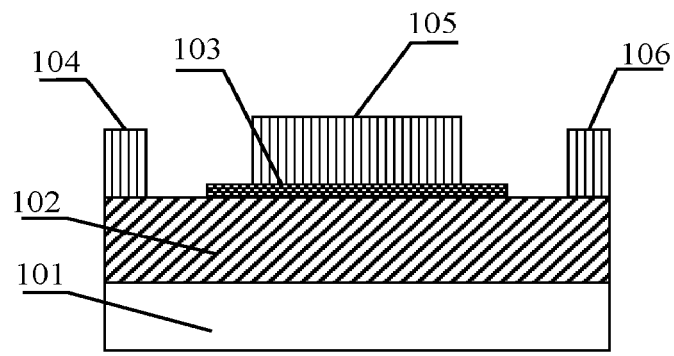
FIG. 7 is a diagram of the second step of the preparation method of the present invention: lithography defines the source and drain electrodes.

2) The source and drain electrodes are defined by photoresist FIGS. 104, 105 and 106, as shown in FIG. 7.

Figure 8:
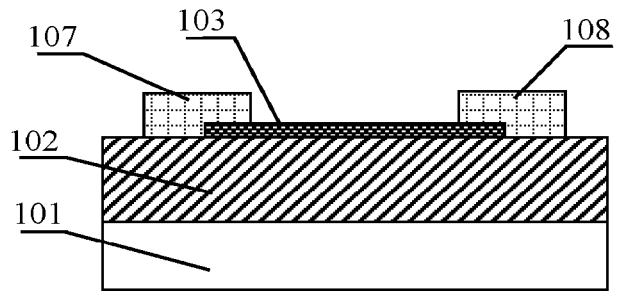
FIG. 8 is a diagram of the third step of the preparation method of the present invention: depositing source and drain metals, removing photoresist and forming the source and drain electrodes.

3) Deposition forms source metal layer 107 and drain metal layer 108, as shown in FIG. 8.

Figure 9:
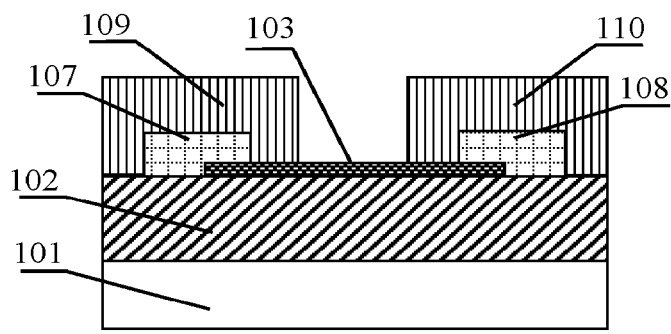
FIG. 9 is a diagram of the fourth step of the preparation method of the present invention: lithography defines the gate electrodes.

4) Gate electrodes are defined by photoresist patterns 109 and 110, as shown in FIG. 9.

Figure 10:
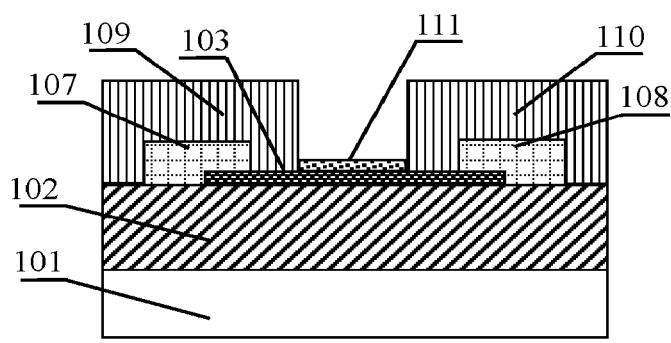
FIG. 10 is a diagram of the fifth step of the preparation method of the present invention: depositing a slightly conductive dielectric material (a medium formed by self-oxidation of a thin layer of aluminum or other slightly conductive medium (such as semi-insulating amorphous silicon, etc.) on a channel material.

5) A gate dielectric layer 111 is formed, as shown in FIG. 10.

Figure 11:
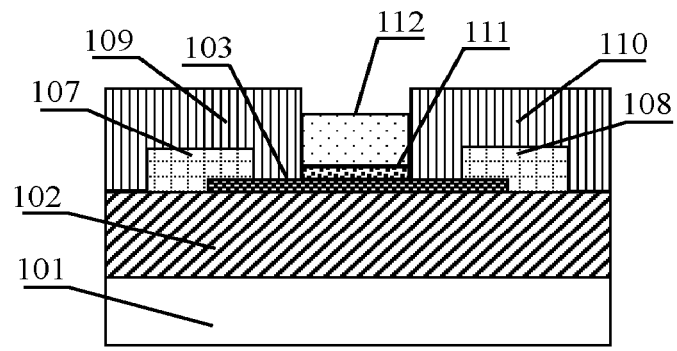
FIG. 11 is a diagram of the sixth step of the preparation method of the present invention: depositing the gate electrode metal.

6) Deposited gate electrode metal layer 112, as shown in FIG. 11.

Figure 12:
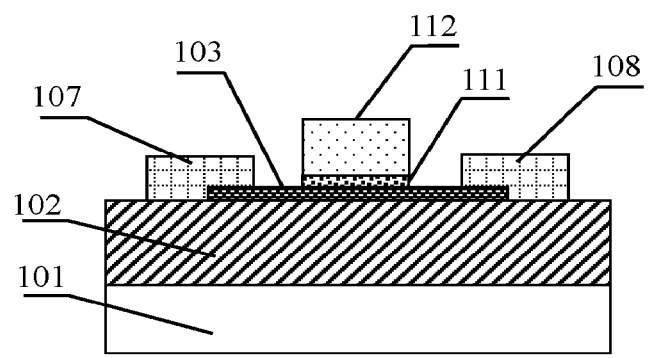
FIG. 12 is a diagram of the seventh step of the preparation method of the present invention: the preparation of gate extraction and injection field effect transistors is completed by removing the photo-resist.

7) Gate extraction and field effect transistor fabrication are accomplished by removing photoresist, as shown in FIG. 12.

Embodiment 6: An Embodiment of a Preparation Method (PN Junction)

See FIGS. 6-13.

Figure 13:
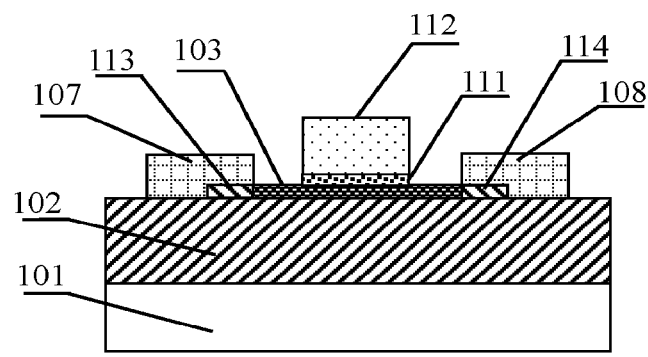
FIG. 13 is a doping schematic diagram of the channel semiconductor region of embodiment 2 of the present invention in the preparation process: doping graphene or other channel semiconductor materials in contact with source and drain electrodes to change the contact between graphene or other channel semiconductor materials and source and drain electrodes.

The preparation method of the present invention comprises the following steps:
1) A channel semiconductor material layer (such as graphene) 103 is formed on the insulating layer, as shown in FIG. 6.
2) The source and drain electrodes are defined by photoresist FIGS. 104, 105 and 106, as shown in FIG. 7.
3) To change the contact between graphene or channel semiconductor material and source-drain electrode by doping the channel semiconductor material in contact with source-drain electrode, as shown in FIG. 13.
4) Deposition forms source metal layer 107 and drain metal layer 108, as shown in FIG. 8.
5) Gate electrodes are defined by photoresist graphics 109 and 110, as shown in FIG. 9.
6) A gate dielectric layer 111 is formed, as shown in FIG. 10.
7) Deposited gate electrode metal layer 112, as shown in FIG. 11.
8) Remove photoresist to complete gate extraction and injection field effect transistor fabrication, as shown in FIG. 12.

Embodiment 7: Switching Device

The present embodiment is a switching device formed by a transistor structure of embodiments 1, 2 or 3. By controlling the gate current, the number of carriers n in channel semiconductor material decreases in order of magnitude. According to $I_{ds}=qvnS$, (q is electronic quantity, v is electronic velocity, n is electronic concentration, S is the area of electron flow) and device power consumption $P=I_{ds}^2R$, switching circuit or digital logic application is carried out, so that the power consumption of device or circuit is significantly reduced.

Implementation 8: Amplifier

The present embodiment is an amplifier formed by a transistor structure of embodiments 1, 2 or 3. By controlling the gate current, the number of carriers in channel semiconductor materials decreases in order of magnitude, so that the device works in the state of fewer carriers, and the analog signal is amplified, thus realizing the characteristics of high gain, high speed, high frequency and good saturation.

Embodiment 9: Memory Device

The present embodiment is a non-volatile semiconductor memory formed by a transistor structure of embodiments 1, 2 or 3. That is, by applying a high enough positive voltage (or negative voltage) to the gate of the device, the device can be turned off. After that, as long as the negative gate voltage (or positive voltage) is not applied, the device will remain in the zero-$I_{ds}$ state for a long time or permanently, thus realizing the storage of information.

In the storage state, the working point of the device is changed from point B to point C by applying positive gate voltage. Thereafter, as long as negative gate voltage is not applied, the device will remain in the zero Ids state for a long time or permanently.

What is claimed is:

1. A gate extraction and injection field effect transistor, comprising: a channel semiconductor region arranged on an insulating layer; a source and a drain are arranged on the channel semiconductor region and are directly connected with the channel semiconductor region; a gate is arranged between the source and the drain; a gate dielectric layer is arranged between the gate and the channel semiconductor region; wherein, the gate dielectric layer is a thin film material with resistance values of $10^3$-$10^{16}\Omega$, and the thin film material of the gate dielectric layer comprises at least one material selected from the group consisting of semi-insulating polycrystalline silicon (SIPOS), amorphous silicon, polycrystalline silicon, amorphous SiC, polycrystalline SiC, amorphous GaN, polycrystalline GaN, amorphous diamond, polycrystalline diamond, amorphous GaAs, and polycrystalline GaAs; and the channel semiconductor region is a two-dimensional semiconductor material or a three-dimensional semiconductor material with two-dimensional semiconductor material characteristics.

2. The gate extraction and injection field effect transistor according to claim 1, wherein, a material of the channel semiconductor region is selected from the group consisting of graphene, black phosphorus, $MoS_2$, $MoSe_2$, $WSe_2$, and silicene.

3. The gate extraction and injection field effect transistor according to claim 1, wherein, the three-dimensional semiconductor material with the two-dimensional semiconductor material characteristics is a material selected from the group consisting of silicon, germanium, GaAs, GaN, SiC, and diamond; wherein, a thickness of the three-dimensional semiconductor material is less than or equal to 10 cellular crystal layers.

4. The gate extraction and injection field effect transistor according to claim 1, wherein the channel semiconductor region is made of an intrinsic semiconductor; the source and the drain are metal electrodes.

5. The gate extraction and injection field effect transistor according to claim 1, wherein, the channel semiconductor region includes two first-conductivity type regions and a second-conductivity type region; a first of the two first-conductivity type regions is disposed between the source and the second-conductivity type region; a second of the two first-conductivity type regions is disposed between the drain and the first of the two first-conductivity type regions;
wherein, the two first-conductivity type regions are made of an N-type semiconductor or a P-type semiconductor; and the second-conductivity type region is made of an N-type semiconductor or a P-type semiconductor.

6. The gate extraction and injection field effect transistor according to claim 1, wherein, the channel semiconductor region includes two first-conductivity type regions and a second-conductivity type region; a first of the two first-conductivity type regions is disposed between the source and the second-conductivity type region; a second of the two first-conductivity type regions is disposed between the drain and the first of the two first-conductivity type regions;
wherein, the two first-conductivity type regions are made of a lightly doped semiconductor and the second-conductivity type region is made of a heavily doped semiconductor, or the two first-conductivity type regions are made of the heavily doped semiconductor and the second-conductivity type region is made of the lightly doped semiconductor.

7. A method of controlling number of carriers in a channel semiconductor region of a field effect transistor, wherein, the field effect transistor comprises the channel semiconductor region arranged on an insulating layer; a source and a drain arranged on the channel semiconductor region and directly connected with the channel semiconductor region; a gate arranged between the source and the drain; a gate dielectric layer arranged between the gate and the channel semiconductor region; wherein, the gate dielectric layer is a thin film material with a resistance value of $10^3$ $10^{16}\Omega$; and the channel semiconductor region is a two-dimensional semiconductor or a three-dimensional semiconductor with two-dimensional semiconductor material characteristics;

the method comprises:
- applying a first gate voltage with an opposite polar to a charge of the channel carriers, and taking out the carriers in the channel; and
- applying a second gate voltage with a polarity opposite to the first gate voltage to inject the carriers into the channel;
- wherein the number of injected carriers from the gate is controlled by an absolute value of the second gate voltage.

* * * * *